United States Patent
Hackitt et al.

(10) Patent No.: US 7,190,068 B2
(45) Date of Patent: Mar. 13, 2007

(54) BOTTOM HEAT SPREADER

(75) Inventors: Dale Hackitt, Mesa, AZ (US); Robert Nickerson, Chandler, AZ (US); Brian Taggart, Phoenix, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/877,586

(22) Filed: Jun. 25, 2004

(65) Prior Publication Data

US 2005/0285260 A1 Dec. 29, 2005

(51) Int. Cl.
H01L 23/10 (2006.01)
H01L 23/34 (2006.01)
H01L 21/50 (2006.01)

(52) U.S. Cl. ............ 257/707; 257/706; 257/712; 257/713; 257/720; 438/122; 438/125

(58) Field of Classification Search ........ 257/706, 257/707, 712, 713, 720, 780, 784, 778; 438/122, 438/125
See application file for complete search history.

(56) References Cited

U.S. PATENT DOCUMENTS

| | | | |
|---|---|---|---|
| 5,777,385 A * | 7/1998 | Wu ............................. 257/712 |
| 5,818,107 A * | 10/1998 | Pierson et al. ............... 257/723 |
| 5,905,299 A | 5/1999 | Lacap | |
| 5,953,589 A | 9/1999 | Shim et al. | |
| 6,191,477 B1 * | 2/2001 | Hashemi ..................... 257/706 |
| 6,265,771 B1 * | 7/2001 | Ference et al. ............. 257/706 |
| 6,809,416 B1 * | 10/2004 | Sharma ....................... 257/706 |
| 2002/0135065 A1 | 9/2002 | Zhao et al. | |
| 2003/0057534 A1 | 3/2003 | Ho et al. | |
| 2003/0146506 A1 | 8/2003 | Khan et al. | |
| 2004/0051170 A1 | 3/2004 | Kawakami et al. | |

OTHER PUBLICATIONS

International Search Report PCT/US2005/022149.

* cited by examiner

*Primary Examiner*—Douglas W. Owens
*Assistant Examiner*—Samuel A Gebremariam
(74) *Attorney, Agent, or Firm*—Blakely, Sokoloff, Taylor & Zafman LLP

(57) ABSTRACT

Embodiments of the invention provide a microelectronic device having a heat spreader positioned between a chip and substrate to which the chip is electrically connected. For one embodiment of the invention, the heat spreader is a thermal slug having a coefficient of thermal expansion approximately equal to the coefficient of thermal expansion of the chip.

26 Claims, 5 Drawing Sheets

BOTTOM HEAT SPREADER

FIELD

Embodiments of the invention relate generally to the field of microelectronic devices and more specifically to methods and apparatuses for removing heat from such devices.

BACKGROUND

Heat dissipation for wire-bonded microelectronic components typically employs a metal slug disposed over the silicon die (chip). FIG. 1 illustrates a wire-bonded device in accordance with the prior art. Device 100, shown in FIG. 1, includes a chip 105 wire-bonded to substrate 110 with wire-bonds 106. The chip 105 may be silicon or some other semiconductor material. During operation, heat is produced, which must be removed from the chip. The substrate 110 may typically be made of ceramic or some type of organic packaging. The substrate 110 is disposed upon a printed circuit board (PCB) (motherboard), not shown.

The heat is removed through a thermal slug 115, which is typically a highly thermally conductive metal such as copper or aluminum. Typically, the thermal slug 115 may be T-shaped to accommodate the wire-bonds 106 as shown. Alternatively, the thermal slug may simply be sized to cover only the inner portion of the chip 105 thereby avoiding the wire-bonds 106. The chip 105 and wire-bonds 106 may then be protected by an encapsulate 120 (typically plastic) applied over the surface of the substrate 110. A heat sink, not shown, may be attached to the thermal slug to increase heat removal capability. Additionally or alternatively, a fan may be directed over the thermal slug.

This heat removal scheme has the disadvantage that the majority of heat removal is taking place from the top of the chip. The top side of the chip may not be the hottest side, depending on where the components are located within the chip. This means the heat is drawn through the upper components of the chip to the thermal slug.

Additional difficulties arise for stacked-chip configurations. Over the past several years there has been some interest in stacking chips where possible. One such chip-stacking scheme stacks a number of decreasing sized chips in order to facilitate the wire-bonds. FIG. 1 A illustrates a stacked-chip device in accordance with the prior art. The stacked-chip device 150 includes a number of successively smaller chips 155–157 stacked atop one another and wire-bonded to a substrate 160. As illustrated in FIG. 1A, the area over which heat slug 165 contacts chip 157 is relatively small compared to the single chip scheme of FIG. 1. Moreover, the increased number of chips produces increased heat, which must be drawn across an even greater distance. That is, much of the heat produced by chip 155 has to be drawn through chips 156 and 157 to the heat slug 165. This applies equally even to stacked-chip schemes that employ methods for stacking same-sized chips (e.g., beveling or intermediate spacers).

Another disadvantage of such schemes is that the coefficient of thermal expansion (CTE) of the heat slug (typically a highly thermally conductive metal) and that of the semiconductor chip (e.g., silicon) are different. Such a mismatch in CTE may result in warping the chip during expected temperature changes that occur during normal operation. This necessitates a thermal interface material (TIM) layer (not shown) between the heat slug and the chip. Inclusion of a TIM layer increases the fabrication process steps and because the TIM layer has its own thermal resistance, reduces the heat removal capability of the device.

Currently, typical stacked-chip designs are used for stacking memory chips, which are relatively low wattage. However, as the number of chips in a stacked-chip device increases, it will be more and more difficult to remove the heat from such devices using the configuration illustrated in FIG. 1A.

Moreover, it may be desirable to stack higher-powered chips (e.g., processors), exclusively or in combination with memory chips. For such designs, the current heat removal schemes will most likely prove inadequate.

BRIEF DESCRIPTION OF THE DRAWINGS

The invention may be best understood by referring to the following description and accompanying drawings that are used to illustrate embodiments of the invention. In the drawings.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout the specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Moreover, inventive aspects lie in less than all features of a single disclosed embodiment. Thus, the claims following the Detailed Description are hereby expressly incorporated into this Detailed Description, with each claim standing on its own as a separate embodiment of this invention.

Figure 2:
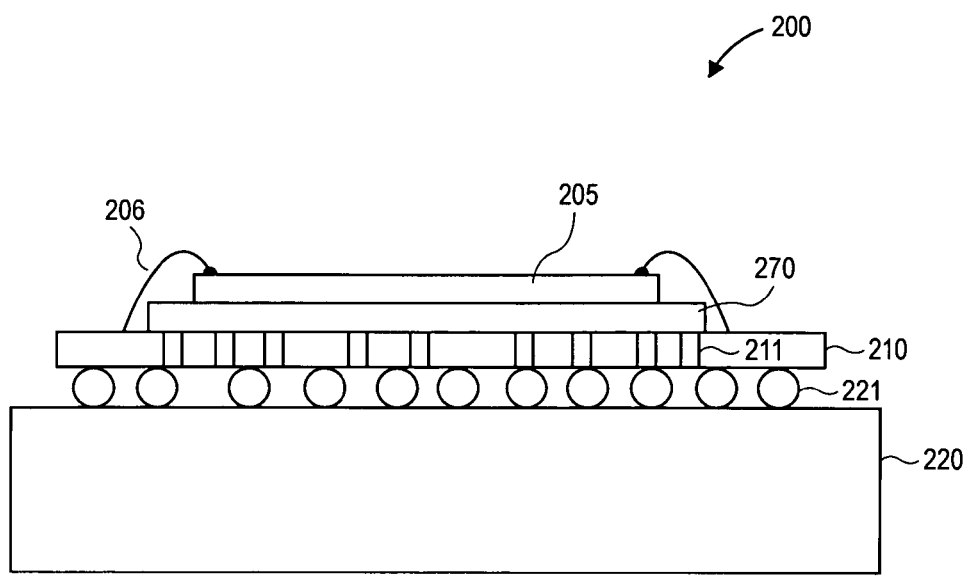
FIG. 2 illustrates a microelectronic device having a bottom heat spreader in accordance with one embodiment of the invention.

FIG. 2 illustrates a microelectronic device having a bottom heat spreader in accordance with one embodiment of the invention. Device 200, shown in FIG. 2, includes a substrate 210 disposed upon a motherboard 220 and electrically connected thereto with conductive balls 221. A chip 205 is wire-bonded to the substrate with wire-bonds 206. Disposed between the chip 205 and the substrate 210 is a thermal slug 270 that acts as a heat spreader. The thermal slug 270 allows heat from the chip to be directed toward the substrate 210. In accordance with one embodiment of the invention, the thermal slug 270 is made of a material having a similar CTE as that of the chip 205. For example, the thermal slug 270 may be made of silicon. For such an embodiment, the thermal slug is a "dummy" piece of silicon. That is, the thermal slug 270 is a piece of silicon having no electrical circuitry implemented therein. This allows the thermal slug to function to dissipate heat from the chip 205. For one embodiment of the invention, because the CTE of the thermal slug is approximately the same as the CTE of the chip, there is no need for a TIM layer between the chip and the thermal slug thereby eliminating the thermal resistance associated with such layers.

Silicon has a relatively high thermal conductivity (approximately 1.48 W/cmK), though not nearly as high as aluminum or copper. This high thermal conductivity allows a great deal of heat to be directed from the chip to the substrate. Moreover, positioning the thermal slug on the bottom of the chip allows the slug to be larger in relation to the size of the chip. Recall that in typical prior art schemes the thermal slug had to be reduced in size (at least at the point of interface to the chip) in order to accommodate the wire-bonds. That is, the area of the thermal slug interface to the chip was smaller than the area of the chip. In accordance with one embodiment of the invention, the thermal slug positioned beneath the chip can be relatively large in relation to the chip. For one embodiment of the invention, the thermal slug is larger than the chip and interfaces to the chip over the entire area of the chip. This larger thermal slug, in conjunction with a greater interface area, allows more heat to be directed from the bottom of the chip to the substrate.

In accordance with one embodiment of the invention, and as shown in FIG. 2, a number of vias 211 are formed through the substrate 210. The vias 211, which are plated with a conductive metal may be used for the electrical connection between the substrate 210 and the motherboard 220. The vias 211 provide not only electrical connection, but also conduct heat from the substrate 210 to the motherboard 220. Typically motherboards may have multiple copper layers and therefore provide a good heat sink. The ability to conduct as much heat as possible from the chip to the motherboard significantly increases the heat removal efficiency of the device. In accordance with one embodiment of the invention, additional vias 211 are formed through the substrate to act solely as thermal vias. For example, more vias than are needed for electrical connections are formed through the substrate. These additional vias, which function solely as thermal vias, increase the amount of heat that can be directed from the chip through the thermal slug and the substrate to the motherboard.

For one embodiment of the invention, the increased area of the thermal slug and the addition of thermal vias, allows the use of thermal vias across an increased amount of the substrate.

Figure 3:
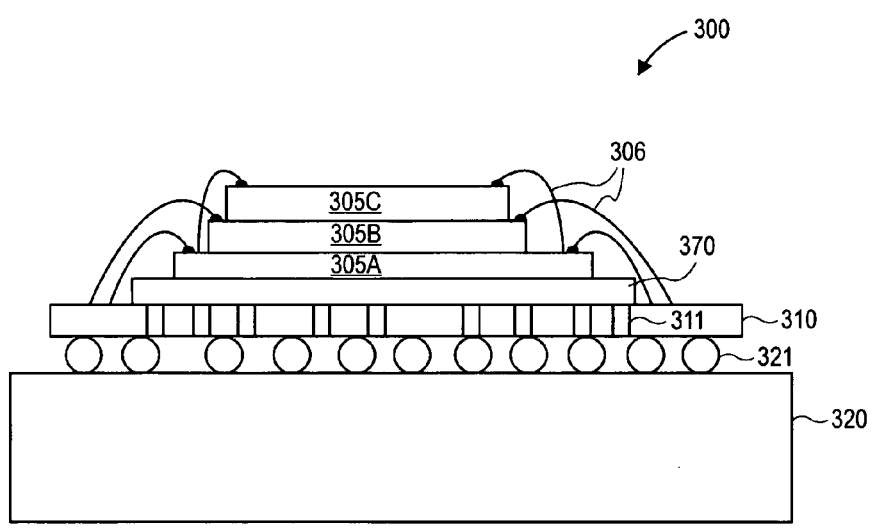
FIG. 3 illustrates a stacked chip microelectronic device having a bottom heat spreader in accordance with one embodiment of the invention.

FIG. 3 illustrates a stacked chip microelectronic device having a bottom heat spreader in accordance with one embodiment of the invention. Device 300, shown in FIG. 3, includes a substrate 310, a motherboard 320, and conductive balls 321 as described above in reference to FIG. 2. As shown in FIG. 3, however, a group of stacked chips 305a–305c are wire-bonded to the substrate and or one to another with wire-bonds 306. Disposed between the bottom chip 305a and the substrate 310 is a thermal slug 370 that acts as a heat spreader. The thermal slug 370 allows heat from the chips 305a–305c to be directed toward the substrate 310. As described above in reference to FIG. 2, vias 311 conduct heat from the substrate to the motherboard 320. Each of the stacked chips 305a–305c may be a memory chip with relatively low wattage. However, in accordance with one embodiment of the invention, one or more of the stacked chips 305a–305c may be a logic processor chip. For such an embodiment, the enhanced efficiency of the thermal slug heat spreader positioned on the bottom of the chip stack allows higher wattage devices (e.g., logic processors) to be stacked and packaged in a single mold. For one embodiment of the invention, chip 305a is a logic processor chip while chips 305b and 305c are memory chips (e.g., flash memory devices).

Figure 1:
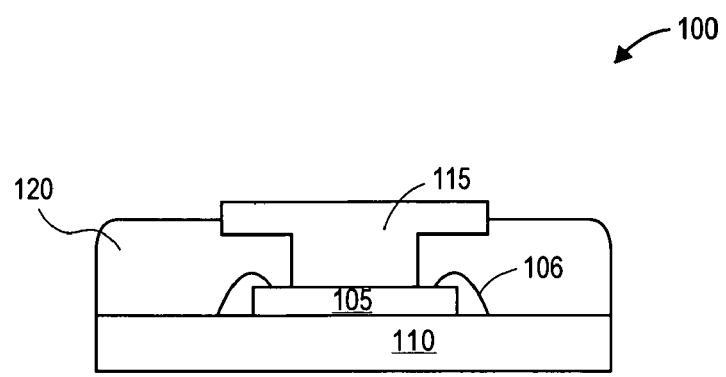
FIG. 1 illustrates a wire-bonded device in accordance with the prior art.
Figure 1A:
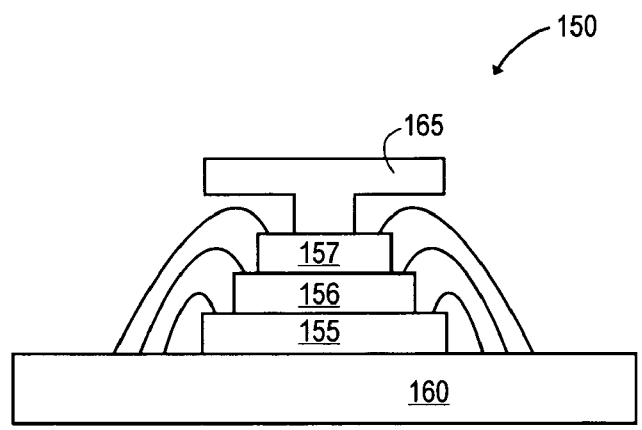
FIG. 1A illustrates a stacked chip device in accordance with the prior art.

Device 300, shown in FIG. 3, may also include a conventional thermal slug (not shown) attached to the top of chip 305c as described above in reference to FIG. 1A. Moreover, the number of chips stacked is exemplary, more or less chips may comprise the chip stack in accordance with various alternative embodiments of the invention.

Figure 4:
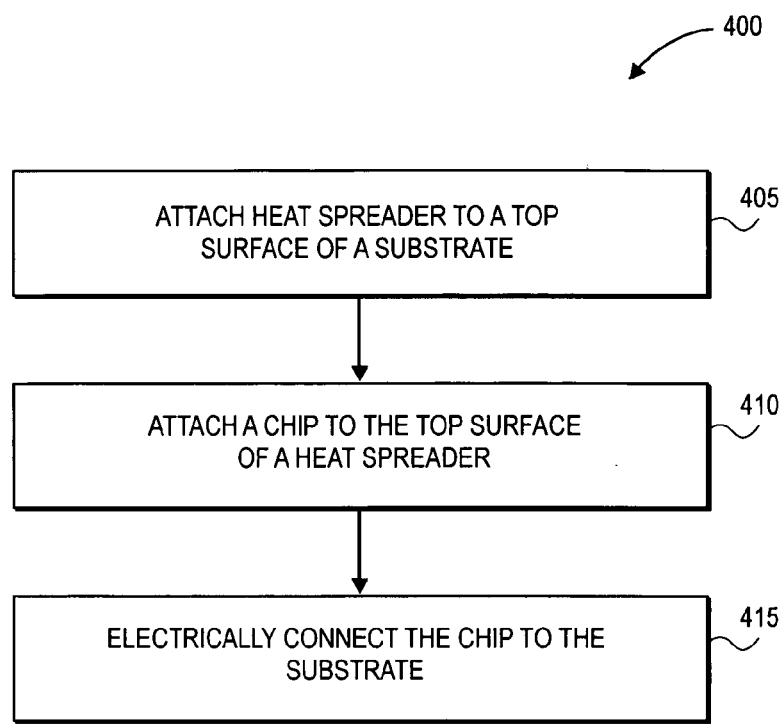
FIG. 4 illustrates a process in which a microelectronic device is produced having a bottom heat spreader.

FIG. 4 illustrates a process in which a microelectronic device is produced having a bottom heat spreader. Process 400, shown in FIG. 4, begins at operation 405 in which a heat spreader is positioned upon a substrate. The heat spreader is attached to the substrate through conventional means. For one embodiment of the invention, the heat spreader is selected to have a CTE that is approximately equal to the CTE of a chip.

At operation 410, a chip is positioned on the heat spreader. For one embodiment, the chip is made of the same material as the heat spreader and has a substantially smaller area than the heat spreader. For alternative embodiments, a chip stack is positioned on the heat spreader. For such embodiments, the bottommost chip (in contact with the heat spreader) has a CTE approximately the same as the heat spreader.

At operation 415, the chip (chip-stack) is electrically connected to the substrate. For example, in one embodiment, the chip is wire-bonded to the substrate, the wire-bonds extending over the heat spreader.

The various operations of process 400 are exemplary and may be described in their most basic form, but operations can be added to or deleted from process 400 without departing from the basic scope of the invention. For example, a conventional heat slug may be attached to the top-side of the chip (or upper most chip) in a conventional manner to increase the heat removal from the chip or chips-stack.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. An apparatus comprising:
   a substrate comprising a via;
   a chip electrically coupled to said via; and
   a heat spreader comprised of a thermal slug having a coefficient of thermal expansion approximately equal to a coefficient of thermal expansion of the chip, the thermal slug having an area greater than an area of the chip and extending over said via, the heat spreader disposed between the substrate and the chip to provide a thermally conductive and electrically resistive path between said chip and said via.

2. The apparatus of claim 1 further comprising:
   a printed circuit board electrically coupled to the substrate.

3. The apparatus of claim 2 wherein one or more thermal vias are formed through the substrate to conduct heat from the substrate to the printed circuit board.

4. The apparatus of claim 3 wherein the heat spreader has a greater area than the chip.

5. The apparatus of claim 1 further comprising:
a second chip stacked upon the chip and electrically coupled to at least one of the chip and the substrate.

6. The apparatus of claim 5 wherein the chip has electronic circuitry formed therein that implements a logic processor.

7. The apparatus of claim 6 further comprising:
one or more additional chips stacked successively upon the second chip, each of the one or more additional chips electrically coupled to at least one of another chip or the substrate.

8. The apparatus of claim 1 wherein the chip is electrically coupled to the substrate with one or more wire-bonds.

9. The apparatus of claim 1 wherein both of the chip and the heat spreader are comprised essentially of silicon.

10. A system comprising:
a logic processor device implemented on a first chip;
a substrate comprising a via electrically coupled to the logic processor device and coupling the logic processor device to a printed circuit board; and
a heat spreader comprised of a thermal slug having a coefficient of thermal expansion approximately equal to a coefficient of thermal expansion of the first chip, the thermal slug having an area greater than an area of the first chip and extending over said via, the heat spreader disposed between the first chip and the substrate to provide a thermally conductive and electrically resistive path between said first chip and said via.

11. The system of claim 10 further comprising:
a memory device coupled to the logic processor device, the memory device implemented on a second chip, the second chip stacked on a top side of the first chip.

12. The system of claim 11 wherein the first chip is comprised essentially of silicon and the coefficient of thermal expansion of the thermal slug is approximately 1.48 W/cmK.

13. The system of claim 11 wherein one or more thermal vias are formed through the substrate to conduct heat from the substrate to the printed circuit board.

14. The system of claim 13 wherein the heat spreader has a greater area than the first chip.

15. The system of claim 11 wherein the substrate is electrically coupled to the logic processor device and the memory device with wire-bonds.

16. The system of claim 10 further comprising:
one or more additional chips stacked successively upon the first chip, each of the one or more additional chips electrically coupled to at least one of another chip or the substrate.

17. The system of claim 10 wherein both of the first chip and the heat spreader are comprised essentially of silicon.

18. A method comprising:
providing a substrate having a top surface, a bottom surface and a via extending there between;
attaching a heat spreader to the top surface to provide a thermally conductive and electrically resistive path to the via, the heat spreader comprised of a thermal slug having a coefficient of thermal expansion approximately equal to a coefficient of thermal expansion of a chip, the thermal slug having an area greater than an area of the chip;
stacking the chip on the heat spreader; and
electrically coupling the chip to the via.

19. The method of claim 18 further comprising:
a printed circuit board electrically coupled to the substrate.

20. The method of claim 19 wherein one or more thermal vias are formed through the substrate to conduct heat from the substrate to the printed circuit board.

21. The method of claim 20 wherein the heat spreader has a greater area than the chip.

22. The method of claim 18 further comprising:
stacking a second chip upon the chip; and
electrically coupling the second chip to at least one of the chip and the substrate.

23. The method of claim 22 wherein the chip has electronic circuitry formed therein that implements a logic processor.

24. The method of claim 23 further comprising:
stacking one or more additional chips upon the second chip; and electrically coupling each of the one or more additional chips to at least one of another chip or the substrate.

25. The method of claim 18 wherein the chip is electrically coupled to the substrate with one or more wire-bonds.

26. The method of claim 18 wherein both of the chip and the heat spreader are comprised essentially of silicon.

* * * * *